(12) United States Patent
Sutardja

(10) Patent No.: US 7,619,919 B2
(45) Date of Patent: Nov. 17, 2009

(54) MULTI-LEVEL MEMORY

(75) Inventor: Pantas Sutardja, Los Gatos, CA (US)

(73) Assignee: Marvell World Trade Ltd., St. Michael (BB)

(*) Notice: Subject to any disclaimer, the term of this patent is extended or adjusted under 35 U.S.C. 154(b) by 276 days.

(21) Appl. No.: 11/728,449

(22) Filed: Mar. 26, 2007

(65) Prior Publication Data
US 2008/0170439 A1 Jul. 17, 2008

Related U.S. Application Data

(60) Provisional application No. 60/884,763, filed on Jan. 12, 2007.

(51) Int. Cl.
G11C 11/34 (2006.01)
(52) U.S. Cl. .................. 365/185.03; 365/185.24; 365/185.05
(58) Field of Classification Search ............ 365/185.03, 365/185.24, 185.05
See application file for complete search history.

(56) References Cited

U.S. PATENT DOCUMENTS

| 6,011,725 | A | 1/2000 | Eitan |
| 6,836,424 | B2 | 12/2004 | Segal et al. |
| 7,038,928 | B1 | 5/2006 | Hsu et al. |
| 7,167,395 | B1 | 1/2007 | Kobernik et al. |
| 7,359,245 | B2 * | 4/2008 | Kim et al. ............. 365/185.18 |
| 2003/0038312 | A1 | 2/2003 | Mikolajick |
| 2004/0213031 | A1 | 10/2004 | Hosono et al. |
| 2006/0164884 | A1 | 7/2006 | Wu |

FOREIGN PATENT DOCUMENTS

| DE | 10 2005 037287 | 1/2007 |
| EP | 1 513 160 | 3/2005 |
| WO | WO2006/036783 | 4/2006 |
| WO | WO2006/107730 | 10/2006 |

OTHER PUBLICATIONS

Notification of Transmittal of The International Search Report and The Written Opinion of The International Searching Authority, or The Declaration dated Jul. 16, 2008 in reference to PCT/US2008/000333 (16 pgs.).
Bloom, Dr. Ilan; "2-Bit Cell NV Memory Minimizes Chip Area with Less Masks"; Jan. 2002 Issue, Nikkei Electronics Asia; 3 pages.
Bloom, Ilan et al; "NROM: Nitride-Based NVM Technology"; Tutorial G, Science and Technology of Nonvolatile Memories, MRS Symposium; Apr. 2006; 28 pages.

(Continued)

Primary Examiner—Son Dinh
Assistant Examiner—Nam Nguyen

(57) ABSTRACT

A storage system includes a charge storage cell and a controller. The charge storage cell includes first and second charge storage regions, each capable of assuming a plurality of charge levels. The controller programs the first charge storage region to one of the plurality of charge levels and then programs the second charge storage region to one of the plurality of charge levels. The controller reads a charge level stored in the first charge storage region based upon a first measurement of the first charge storage region and a second measurement of the second charge storage region.

34 Claims, 11 Drawing Sheets

OTHER PUBLICATIONS

Eitan, Boaz et al; "Can NROM, a 2-bit, Trapping Storage NVM Cell, Give a Real Challenge to Floating Gate Cells?"; Presented at the International Conference on Solid State Devices and Materials, Tokyo, Jan. 1999; 3 pages.

Maayan, Eduardo et al; "6.1 A 512 Mb NROM Data Storage Memory with 8MB/s data rate"; Presented at the ISSCC (International Solid-State Circuits Conference), San Francisco, Feb. 2002; 8 pages.

* cited by examiner

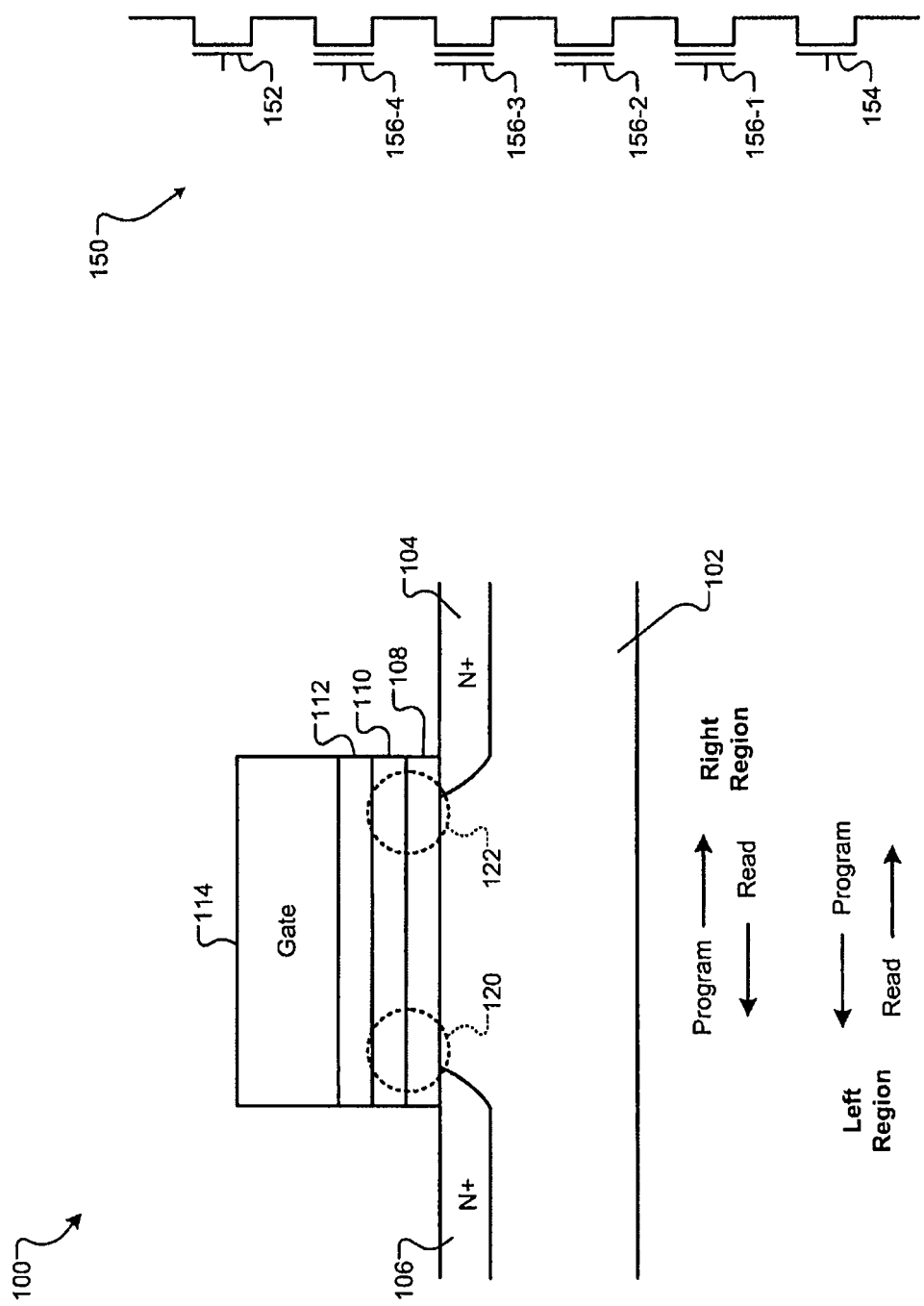

MULTI-LEVEL MEMORY

CROSS-REFERENCE TO RELATED APPLICATIONS

This application claims the benefit of U.S. Provisional Application No. 60/884,763, filed on Jan. 12, 2007. The disclosure of the above application is incorporated herein by reference in its entirety.

FIELD

The present disclosure relates to charge storage memories, and more specifically to accurately reading stored values from charge storage memories.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a cross-sectional view of a dual-edged memory cell 100 according to the prior art is shown. In various implementations, the dual-edged memory cell 100 may be nitride-based and may include a nitride read-only memory (NROM) transistor from Saifun Semiconductors, Ltd. The dual-edged memory cell 100 is referred to hereinafter as the transistor 100.

The transistor 100 includes a p-doped substrate 102, a first n+ doped region ("right contact") 104, which can be used as a source or drain. The transistor 100 also includes a second n+ doped region ("left contact") 106, which can be used as a drain or source. The transistor 100 further includes a first gate dielectric layer 108, a trapping material (such as nitride) layer 110, a second gate dielectric layer 112, and a polysilicon gate 114.

The transistor 100 can store charge in two regions, generally depicted in FIG. 1 as two circular regions: a left region 120 and a right region 122. The amount of charge stored in the left and right regions 120 and 122 affects the threshold voltage of the transistor 100, which is a property that can be used to store data.

Because the transistor 100 is substantially symmetrical, right and left contacts 104 and 106 can be used interchangeably as source and drain. In order to program the right region 122, a positive voltage is applied to the gate 114 and to the right contact 104, while the left contact 106 is held at ground. Electrons then travel from the left contact 106 to the right contact 104, and some gain sufficient energy to pass through the first gate dielectric layer 108 and become trapped in the nitride layer 110. The charge may be trapped within the right region 122.

The charge trapped in the right region 122 has a dramatic effect on the threshold voltage of the transistor 100 when reading in a direction opposite to the programming direction. In other words, a voltage is applied to the gate 114 and to the left contact 106, while the right contact 104 is held at ground. This voltage is generally less than the voltage used for programming the transistor 100. The amount of current that then flows through the transistor 100 is indicative of the threshold voltage of the transistor 100 in the read direction, and thus the amount of charge trapped in the right region 122.

The arrows below the transistor 100 indicate the direction of flow of electrons during programming and reading operations for each of the left and right regions 120 and 122. The voltages for programming and reading are reversed for the left region 120. For instance, a program is performed for the right region 122 when electrons flow from the left contact 106 to the right contact 104. This is accomplished by holding the right contact 104 at a higher potential than the left contact 106.

A read of the right region 122 is performed by holding the left contact 106 at a higher potential so that electrons will flow to the left contact 106 during the read. For the left region 120, a program operation involves holding the left contact 106 at a higher potential than the right contact 104. A read of the left region 120 can be performed by holding the right contact 104 at a higher potential than the left contact 106.

Referring now to FIG. 2, a functional schematic of an array 150 of storage cells within a NAND flash memory according to the prior art is depicted. The array 150 includes top and bottom select transistors 152 and 154, which may be n-channel metal-oxide-semiconductor field-effect transistors (n-MOSFETs). The array 150 also includes four NAND storage cells 156-1, 156-2, 156-3, and 156-4 connected in series between the bottom select transistor 154 and the top select transistor 152. The NAND storage cells 156 may be implemented as floating gate n-MOSFET devices.

A NAND storage cell, such as NAND storage cell 156-4, can be programmed by placing a large voltage, such as 20 volts, on the gate of NAND storage cell 156-4. The top select transistor 152 will also receive 20 volts at its gate, while the bottom select transistor 154 will have its gate grounded. The drain of the top select transistor 152 will also be grounded.

The gates of NAND storage cells 156-3, 156-2, and 156-1, which will not be programmed, are held at a voltage, such as 5 volts, that is enough to turn the transistor on without programming it. Electrons are trapped in the floating gate of NAND storage cell 156-4, thereby changing its threshold voltage.

Reading NAND storage cell 156-4 involves turning on the other NAND storage cells 156-3, 156-2, and 156-1 by applying a turn-on voltage, such as 5 volts. The top and bottom select transistors 152 and 154 are also turned on. The gate of NAND storage cell 156-4 is held at a voltage where a changed threshold voltage will be evidenced as a large change in drain current.

A predetermined current, such as an average of currents sunk by the NAND storage cell 156-4 at different threshold voltages, is placed into the drain of the top select transistor 152. If this current is higher than the current being sourced by NAND storage cell 156-4, the voltage at the drain of the top select transistor 152 will increase; otherwise, the voltage at the drain of the top select transistor 152 will decrease. This voltage level can be measured to infer the threshold voltage of the NAND storage cell 156-4, and thus the program state of NAND storage cell 156-4.

Referring now to FIG. 3, a functional block diagram of a memory 200 according to the prior art is depicted. The memory 200 includes storage cell arrays 202 and a controller 204. The storage cell arrays 202 may be composed of such devices as dual-edged memory cells, as described in FIG. 1, and NAND storage cells, as described in FIG. 2. The controller 204 communicates outside the memory 200 with an external device, and programs, erases, and reads the storage cell arrays 202.

SUMMARY

A storage system comprises a charge storage cell and a controller. The charge storage cell includes first and second charge storage regions, each capable of assuming a plurality of charge levels. The controller programs the first charge storage region to one of the plurality of charge levels and then programs the second charge storage region to one of the plurality of charge levels. The controller reads a charge level stored in the first charge storage region based upon a first measurement of the first charge storage region and a second measurement of the second charge storage region.

In other features, the controller reads a charge level stored in the second charge storage region based upon the second measurement. The storage system further comprises a lookup table of charge levels indexed by the first measurement and the second measurement. The controller determines the charge level stored in the first charge storage region using the lookup table. The charge storage cell comprises a nitride read-only memory transistor.

In further features, the charge storage cell further comprises a third charge storage region capable of assuming a plurality of charge levels, the controller programs the third charge storage region after the second charge storage region, and the controller reads a charge level stored in the first charge storage region based upon the first measurement and at least one of the second measurement and a third measurement of the third charge storage region.

In still other features, the controller programs iteratively by making a measurement after each programming interval until a desired one of the plurality of charge levels is reached. A first programming interval for the second charge storage region is conducted based upon the charge level stored in the first charge storage region. The storage system further comprises a second charge storage cell having first and second charge storage regions, each capable of assuming a plurality of charge levels. The controller programs the first and second charge storage regions of the second charge storage cell after programming the first and second charge storage regions of the charge storage cell.

In other features, the controller reads a charge level stored in the first charge storage region of the second charge storage cell based upon a third measurement of the first charge storage region of the second charge storage cell and a fourth measurement of the second charge storage region of the second charge storage cell. The controller reads a charge level stored in the second charge storage region of the charge storage cell based upon the second measurement and at least one of the third measurement and the fourth measurement.

A storage system comprises M charge storage cells and a controller. The M charge storage cells each include a charge storage region that can assume one of N charge levels, wherein N and M are integers greater than one. The controller programs a first cell of the M charge storage cells to one of the N charge levels and subsequently programs a second cell of the M charge storage cells to one of the N charge levels. The controller reads a charge level stored in the first cell based upon a first measurement of the first cell and a second measurement of the second cell.

In other features, the controller reads a charge level stored in the second cell based upon the second measurement. The storage system further comprises a lookup table of charge levels indexed by the first measurement and the second measurement. The controller reads the charge level stored in the first cell using the lookup table. The M charge storage cells comprise NAND flash transistors. The controller programs a third one of the M charge storage cells after the second cell and reads a charge level stored in the first cell based upon the first measurement and at least one of the second measurement and a third measurement of the third cell.

In further features, the controller programs iteratively by making a measurement after each programming interval until a desired one of the N charge levels is reached. A first programming interval for the second cell is conducted based upon the charge level stored in the first cell. The M charge storage cells each include a plurality of charge storage regions including the charge storage region that can assume one of N charge levels. The controller programs first and second charge storage regions of the second cell after programming first and second charge storage regions of the first cell.

In still other features, the first charge storage region of the first cell comprises the charge storage region of the first cell and the first charge storage region of the second cell comprises the charge storage region of the second cell. The controller reads a charge level stored in the first charge storage region of the second cell based upon the second measurement and a third measurement of the second charge storage region of the second cell. The controller reads a charge level stored in the second charge storage region of the first cell based upon a fourth measurement of the second charge storage region of the first cell and at least one of the second and third measurements.

A method comprises programming a first charge storage region of a charge storage cell to one of a plurality of charge levels; programming a second charge storage region of the charge storage cell to one of the plurality of charge levels after programming the first charge storage region; performing first and second measurements on the first and second charge storage regions, respectively; and reading a charge level stored in the first charge storage region based upon the first and second measurements.

In other features, the method further comprises reading a charge level stored in the second charge storage region based upon the second measurement. The method further comprises providing a lookup table of charge levels indexed by the first measurement and the second measurement; and reading the charge level stored in the first charge storage region using the lookup table. The charge storage cell comprises a nitride read-only memory transistor.

In further features, the method further comprises programming a third charge storage region of the charge storage cell after programming the second charge storage region; performing a third measurement on the third charge storage region; and reading a charge level stored in the first charge storage region based upon the first measurement and at least one of the second measurement and the third measurement. The method further comprises programming iteratively by making a measurement after each programming interval until a desired one of the plurality of charge levels is reached.

In still other features, the method further comprises conducting a first programming interval for the second charge storage region based upon the charge level stored in the first charge storage region. The method further comprises programming first and second charge storage regions of a second charge storage cell after programming the first and second charge storage regions of the charge storage cell; performing third and fourth measurements on the first and second charge storage regions of the second charge storage cell, respectively; reading a charge level stored in the first charge storage region of the second charge storage cell based upon the third fourth measurements; and reading a charge level stored in the second charge storage region of the charge storage cell based upon the second measurement and at least one of the third and fourth measurements.

A method comprises programming a first cell of M charge storage cells to one of N charge levels, wherein N and M are integers greater than one; programming a second cell of the M charge storage cells to one of the N charge levels after programming the first cell; performing first and second measurements on the first and second cells, respectively; and reading a charge level stored in the first cell based upon the first and second measurements.

In other features, the method further comprises reading a charge level stored in the second cell based upon the second measurement. The method further comprises providing a lookup table of charge levels indexed by the first measurement and the second measurement; and reading the charge level stored in the first cell using the lookup table. The M charge storage cells comprise NAND flash transistors.

In further features, the method further comprises programming a third one of the M charge storage cells after programming the second cell; performing a third measurement on the third cell; and reading a charge level stored in the first cell based upon the first measurement and at least one of the second and third measurements. The method further comprises programming iteratively by making a measurement after each programming interval until a desired one of the N charge levels is reached.

In still other features, the method further comprises conducting a first programming interval for the second cell based upon the charge level stored in the first cell. The method further comprises programming first and second charge storage regions of the second cell after programming first and second charge storage regions of the first cell. The first charge storage region of the first cell comprises the charge storage region of the first cell and the first charge storage region of the second cell comprises the charge storage region of the second cell.

In other features, the method further comprises performing third and fourth measurements on the second charge storage region of the first and second cells, respectively; reading a charge level stored in the first charge storage region of the second cell based upon the second and fourth measurements; and reading a charge level stored in the second charge storage region of the first cell based upon the third measurement and at least one of the second and fourth measurements.

A storage system comprises charge storing means having a first charge storage region for assuming a plurality of charge levels and a second charge storage region for assuming the plurality of charge levels; and control means for programming the first charge storage region to one of the plurality of charge levels, for subsequently programming the second charge storage region to one of the plurality of charge levels, and for reading a charge level stored in the first charge storage region based upon a first measurement of the first charge storage region and a second measurement of the second charge storage region.

In other features, the control means reads a charge level stored in the second charge storage region based upon the second measurement. The storage system further comprises lookup means for looking up a charge level from the first measurement and the second measurement. The control means determines the charge level stored in the first charge storage region using the lookup table. The charge storing means comprises a nitride read-only memory transistor.

In further features, the charge storing means further comprises a third charge storage region for assuming a plurality of charge levels, the control means programs the third charge storage region after the second charge storage region, and the control means reads a charge level stored in the first charge storage region based upon the first measurement and at least one of the second measurement and a third measurement of the third charge storage region.

In still other features, the control means programs iteratively by making a measurement after each programming interval until a desired one of the plurality of charge levels is reached. A first programming interval for the second charge storage region is conducted based upon the charge level stored in the first charge storage region. The storage system further comprises second charge storing means having a first charge storage region for assuming a plurality of charge levels and a second charge storage region for assuming a plurality of charge levels.

In other features, the control means programs the first and second charge storage regions of the second charge storing means after programming the first and second charge storage regions of the charge storing means. The control means reads a charge level stored in the first charge storage region of the second charge storing means based upon a third measurement of the first charge storage region of the second charge storing means and a fourth measurement of the second charge storage region of the second charge storing means. The control means reads a charge level stored in the second charge storage region of the charge storing means based upon the second measurement and at least one of the third measurement and the fourth measurement.

A storage system comprises M charge storing means that each include a charge storage region for assuming one of N charge levels, wherein N and M are integers greater than one; and control means for programming a first cell of the M charge storing means to one of the N charge levels, for subsequently programming a second cell of the M charge storing means to one of the N charge levels, and for reading a charge level stored in the first cell based upon a first measurement of the first cell and a second measurement of the second cell.

In other features, the control means reads a charge level stored in the second cell based upon the second measurement. The storage system further comprises lookup means for providing a charge level based upon the first measurement and the second measurement. The control means reads the charge level stored in the first cell using the lookup table. The M charge storing means comprise NAND flash transistors.

In further features, the control means programs a third one of the M charge storing means after the second cell and reads a charge level stored in the first cell based upon the first measurement and at least one of the second measurement and a third measurement of the third cell. The control means programs iteratively by making a measurement after each programming interval until a desired one of the N charge levels is reached. A first programming interval for the second cell is conducted based upon the charge level stored in the first cell.

In still other features, the M charge storing means each include a plurality of charge storage regions including the charge storage region that can assume one of N charge levels. The control means programs first and second charge storage regions of the second cell after programming first and second charge storage regions of the first cell. The first charge storage region of the first cell comprises the charge storage region of the first cell and the first charge storage region of the second cell comprises the charge storage region of the second cell.

In other features, the control means reads a charge level stored in the first charge storage region of the second cell based upon the second measurement and a third measurement of the second charge storage region of the second cell. The control means reads a charge level stored in the second charge storage region of the first cell based upon a fourth measurement of the second charge storage region of the first cell and at least one of the second and third measurements.

A computer program stored for use by a processor for operating a storage system comprises programming a first charge storage region of a charge storage cell to one of a plurality of charge levels; programming a second charge storage region of the charge storage cell to one of the plurality of charge levels after programming the first charge storage region; performing first and second measurements on the first and second charge storage regions, respectively; and reading a charge level stored in the first charge storage region based upon the first and second measurements.

In other features, the computer program further comprises reading a charge level stored in the second charge storage region based upon the second measurement. The computer program further comprises providing a lookup table of charge levels indexed by the first measurement and the second measurement; and reading the charge level stored in the first charge storage region using the lookup table. The charge storage cell comprises a nitride read-only memory transistor.

In further features, the computer program further comprises programming a third charge storage region of the charge storage cell after programming the second charge storage region; performing a third measurement on the third charge storage region; and reading a charge level stored in the first charge storage region based upon the first measurement and at least one of the second measurement and the third measurement. The computer program further comprises programming iteratively by making a measurement after each programming interval until a desired one of the plurality of charge levels is reached.

In still other features, the computer program further comprises conducting a first programming interval for the second charge storage region based upon the charge level stored in the first charge storage region. The computer program further comprises programming first and second charge storage regions of a second charge storage cell after programming the first and second charge storage regions of the charge storage cell; performing third and fourth measurements on the first and second charge storage regions of the second charge storage cell, respectively; reading a charge level stored in the first charge storage region of the second charge storage cell based upon the third fourth measurements; and reading a charge level stored in the second charge storage region of the charge storage cell based upon the second measurement and at least one of the third and fourth measurements.

A computer program stored for use by a processor for operating a storage system comprises programming a first cell of M charge storage cells to one of N charge levels, wherein N and M are integers greater than one; programming a second cell of the M charge storage cells to one of the N charge levels after programming the first cell; performing first and second measurements on the first and second cells, respectively; and reading a charge level stored in the first cell based upon the first and second measurements.

In other features, the computer program further comprises reading a charge level stored in the second cell based upon the second measurement. The computer program further comprises providing a lookup table of charge levels indexed by the first measurement and the second measurement; and reading the charge level stored in the first cell using the lookup table. The M charge storage cells comprise NAND flash transistors.

In further features, the computer program further comprises programming a third one of the M charge storage cells after programming the second cell; performing a third measurement on the third cell; and reading a charge level stored in the first cell based upon the first measurement and at least one of the second and third measurements. The computer program further comprises programming iteratively by making a measurement after each programming interval until a desired one of the N charge levels is reached.

In still other features, the computer program further comprises conducting a first programming interval for the second cell based upon the charge level stored in the first cell. The computer program further comprises programming first and second charge storage regions of the second cell after programming first and second charge storage regions of the first cell. The first charge storage region of the first cell comprises the charge storage region of the first cell and the first charge storage region of the second cell comprises the charge storage region of the second cell.

In other features, the computer program further comprises performing third and fourth measurements on the second charge storage region of the first and second cells, respectively; reading a charge level stored in the first charge storage region of the second cell based upon the second and fourth measurements; and reading a charge level stored in the second charge storage region of the first cell based upon the third measurement and at least one of the second and fourth measurements.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a cross-sectional view of a dual-edged memory cell according to the prior art;

FIG. 2 is a functional schematic of an array of storage cells within a NAND flash memory according to the prior art;

DETAILED DESCRIPTION

Figure 4:
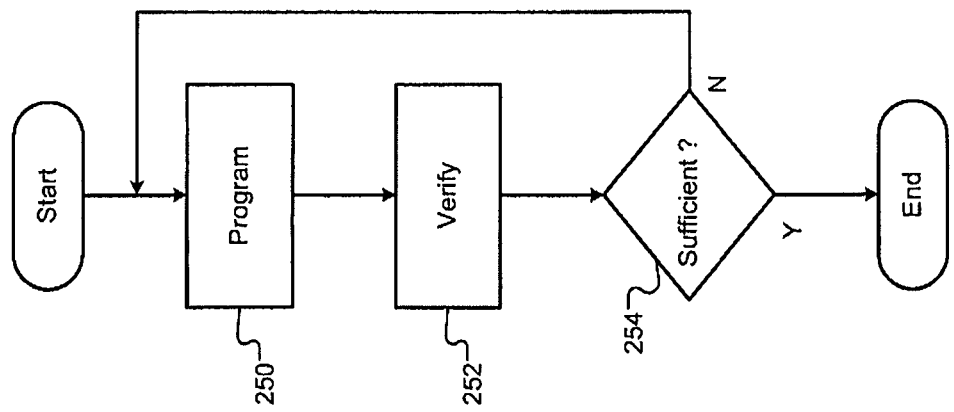
FIG. 4 is a flowchart depicting exemplary steps performed in a programming operation according to the principles of the present disclosure.
Figure 3:
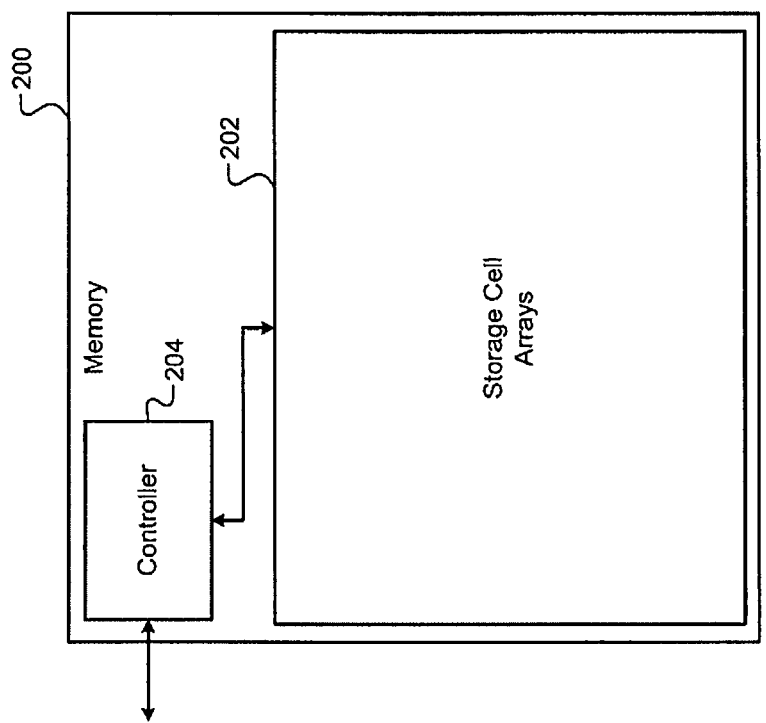
FIG. 3 is a functional block diagram of a memory according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module, circuit, and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIG. 4, a flowchart depicts exemplary steps performed in a programming operation according to the principles of the present disclosure. When a charge storage cell is programmed, programming conditions are applied to the charge storage cell for a specified period of time. When a charge storage cell occupies one of two states (storing one bit), there are such large error margins that programming for a fixed period of time will reliably change the charge storage cell from one state to the other. However, when a single charge storage cell can assume more than two levels, an iterative process can be used to ensure that the charge storage cell is programmed accurately to the correct state.

Control begins in step 250. In step 250, control applies programming conditions to a charge storage cell, such as those described for dual-edged memory cells and NAND storage cells above. Control continues in step 252, where control performs a verification function, such as a read, on the charge storage cell. Control continues in step 254, where if the state of the charge storage cell has reached the desired level, control ends; otherwise, control returns to step 250.

The flowchart of FIG. 4 describes a programming operation for charge storage cells whose charge can only be modified in one direction. If the charge storage cell is over-programmed, an entire group of charge storage cells may have to be erased back to an erased state before re-attempting programming. If a charge level of a charge storage cell can be decreased without fully erasing, or if the charge storage cell can be erased individually, the flowchart of FIG. 4 may be modified. An erase or deprogram step may be added to achieve accurate programming when one of the program iterations overshoots the desired amount of charge. Programming may be performed in larger steps if a charge correction can remove overshoot.

Figures 5, 6:
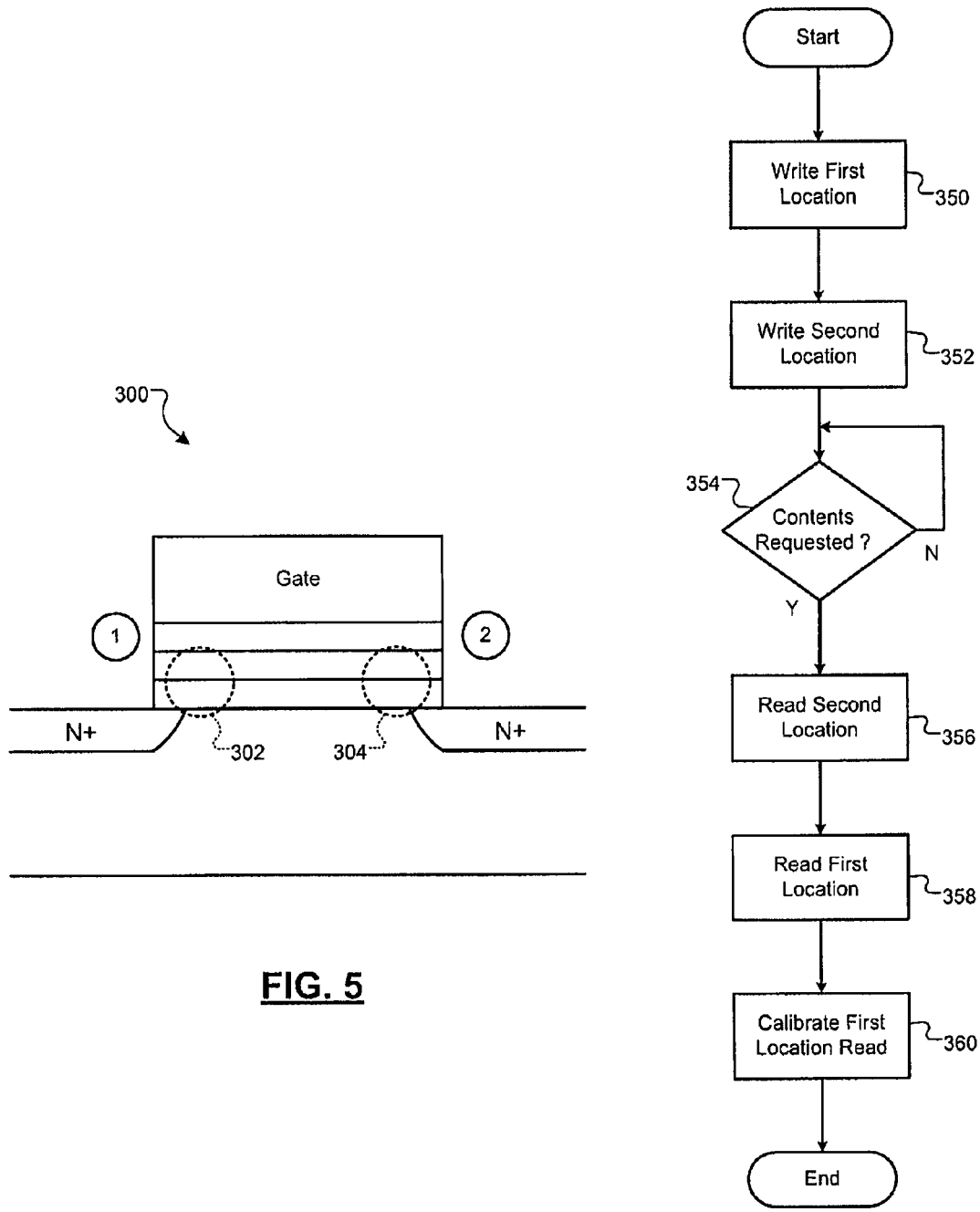
FIG. 5 is a cross-sectional view of an exemplary dual-edged memory cell according to the principles of the present disclosure.
FIG. 6 is a flowchart depicting exemplary steps performed in writing and reading storage cells of FIG. 5 according to the principles of the present disclosure.

Referring now to FIG. 5, a cross-sectional view of an exemplary dual-edged memory cell 300 according to the principles of the present disclosure is depicted. The cell 300 may be nitride-based and may include a nitride read-only memory (NROM) transistor from Saifun Semiconductors, Ltd. The cell 300 includes two areas of charge storage, a left region 302 and a right region 304. The left region 302 is programmed, as described with respect to FIG. 1, to have a certain amount of charge.

For example, to store four levels within the left region 302, the cell 300 may provide for an erased level having the least amount of charge and three programmed levels with increasing amounts of charge. The iterative programming process described in FIG. 4 can be used to ensure that the left region 302 is accurately programmed to one of the three programmed levels.

When the left region 302 is read, as described in FIG. 1, the amount of charge in the left region 302 alters the threshold voltage and therefore alters the current produced as the cell 300 is read. The left and right regions 302 and 304 may be programmed in either order, and if more charge storage regions exist, they too can be programmed in any order.

Reading from the left and right regions 302 and 304 takes place in the opposite order from the order in which they were written. For the purposes of the present explanation, two storage regions are described, and the left region 302 is programmed first, as indicated by the circled 1 of FIG. 5. The method of FIG. 4 may be sued to program the left region 302. After the left region 302 is programmed, the right region 304 may be programmed. When programming the right region 304, the method of FIG. 4 may also be used.

The iterative programming process of FIG. 4 proceeds until the charge level within the right region 304 is accurately read. The right region 304 is therefore accurately programmed regardless of what state the left region 302 was in. However, when the left region 302 was programmed, the right region 304 was still in its natural erased state. Once the right region 304 is programmed, reading the left region 302 is affected by the programming state of the right region 304.

When there are only two charge levels per region, the effect of the other region upon a read may be insignificant. However, when storing more levels per region, this effect may need to be accounted for. To do this, the right region 304 can be read first. Because its programming level was iteratively set to a known state, the value of the right region 304 can be accurately determined. If the effect of a given state of the right region 304 on the value read from the left region 302 is known, the impact of the right region 304 can be programmatically removed from a value read from the left region 302.

The impact of the right region 304 on reading the left region 302 may be determined through modeling, or may be determined empirically by measuring the value read from the left region 302 at different programming levels of the right region 304. The knowledge gained by this empirical determination may also impact design decisions about the charge levels used for programming the cell 300 to improve error margins.

Referring now to FIG. 6, a flowchart depicts exemplary steps performed in writing and reading storage cells of FIG. 5 according to the principles of the present disclosure. Control begins in step 350, where the first location is written. The first location may be programmed iteratively, as described with respect to FIG. 4. Control continues in step 352, where the second cell location is written. The second cell location may also be programmed iteratively. The iterative programming process may be modified based upon data stored in the first location.

For instance, data stored in the first cell location may cause more charge to be needed at the second cell location in order to reach the desired value. In this case, the iterative programming cycles may be increased in intensity, such as by increasing current, voltage, and/or programming time. Correspondingly, if previously written values will cause a location to more quickly reach the desired value, programming cycles may be decreased in intensity. In various implementations, only the first programming iteration is altered based upon previously written values. Control then continues in step 354. Control waits in step 354 until contents of the cell are requested, at which point control transfers to step 356.

To retrieve the contents of the cell, a reverse reading process can be used, where the data written to the first location is determined based upon raw values read from the first and second locations. In step 356, a raw value for the second location is read. Because the effect of data stored in the first location was accounted for in writing the second location, the raw value read from the second location can be used as data.

Control then continues in step 358, where a raw value for the first location is read. Control continues in step 360, where the raw value read from the first location is calibrated based upon the raw value read from the second location. Calibration may be accomplished by looking up a calibrated data value from a table indexed by the raw values of the first and second locations. Other ways of calibrating include evaluating a function that depends on the raw values of the first and second locations.

The data stored at both locations has now been accurately read and control ends. In various implementations, control may return to step 354 for further reads, and control may perform other steps to allow for erasing. A reverse reading process can be applied to any memory device type or configuration where writing data affects the ability to read previously written data. This includes situations where writing new data alters stored data and where writing new data affects how the stored data appears when read.

Figures 7, 8:
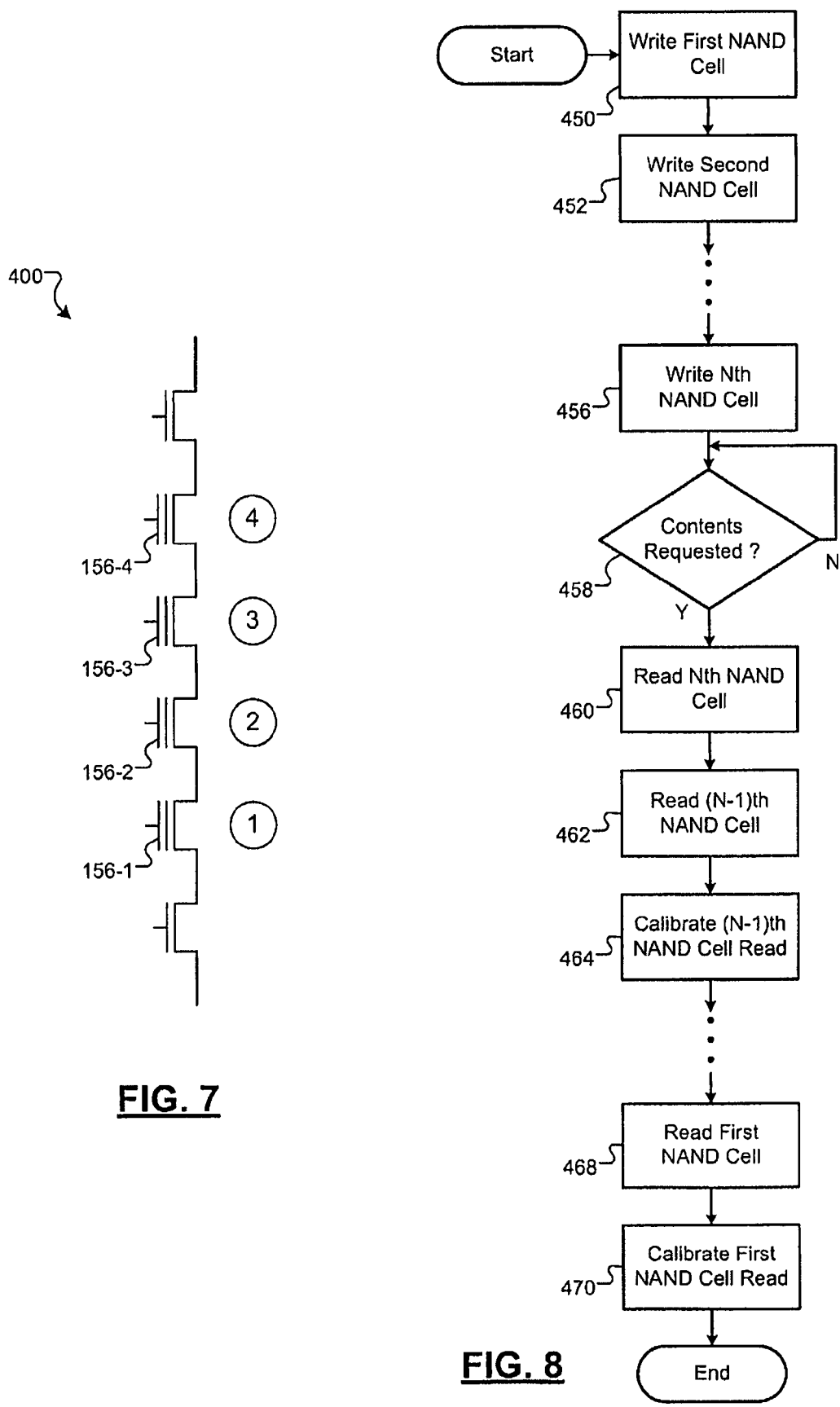
FIG. 7 is a functional schematic of an array of storage cells of an exemplary NAND flash memory according to the principles of the present disclosure.
FIG. 8 is a flowchart depicting exemplary steps performed in writing and reading storage cells of FIG. 7 according to the principles of the present disclosure.

Referring now to FIG. 7, a functional schematic of an array 400 of storage cells of an exemplary NAND flash memory according to the principles of the present disclosure is depicted. For purposes of clarity, reference numerals from FIG. 2 are used to identify similar components. NAND storage cell 156-1 can be written first, as indicated in FIG. 7 by a circled 1. NAND storage cell 156-2 can be written next.

By using the iterative programming procedure of FIG. 4, the programming state of NAND storage cell 156-2 can be accurately set regardless of the effect of NAND storage cell 156-1. Next, NAND storage cell 156-3 is written, followed by NAND storage cell 156-4. When NAND storage cell 156-3 was written, NAND storage cell 156-4 was in its erased state. Therefore, programming NAND storage cell 156-4 may affect the read process of NAND storage cell 156-3. As such, the NAND storage cells should be read in reverse order, from circle 4 to 3 to 2 to 1.

Referring now to FIG. 8, a flowchart depicts exemplary steps performed in writing and reading storage cells of FIG. 7 according to the principles of the present disclosure. Control begins in step 450, where a first NAND storage cell is written. Control continues in step 452, where a second NAND storage cell is written.

Control continues writing NAND storage cells until the Nth NAND storage cell is written in step 456. In the exemplary array 400 of FIG. 7, N is equal to 4. Control then continues in step 458, where control waits for the contents of the NAND storage cells to be requested. Once requested, control continues in step 460; otherwise, control remains in step 458.

In step 460, the Nth NAND storage cell is read. Control continues in step 462, where the (N−1)th NAND storage cell is read. Control continues in step 464, where the (N−1)th NAND storage cell is calibrated based on the value read from the Nth NAND storage cell. Control continues reading subsequent NAND storage cells and calibrating them based upon previous values until control reads the first NAND storage cell in step 468.

Control continues in step 470, where the value read from the first NAND storage cell is calibrated based upon values of NAND storage cells read previously. The first NAND storage cell may be calibrated with values from the prior NAND storage cell, all other NAND storage cells within the array, or some number of NAND storage cells fewer than all, depending upon the extent of their influence. Control then ends.

Figure 9:
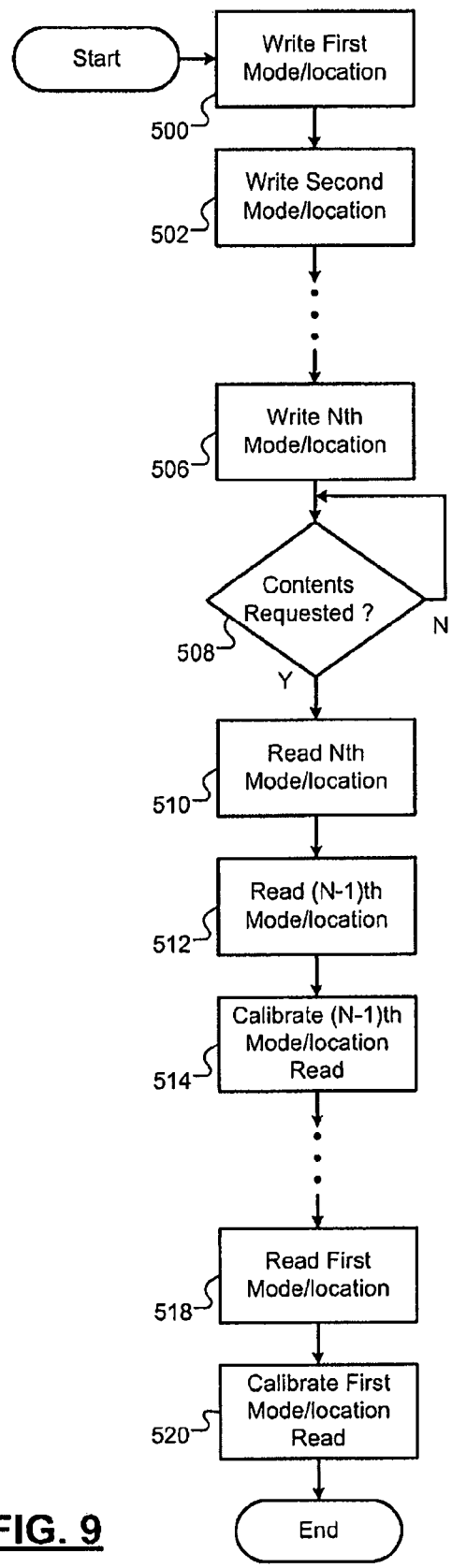
FIG. 9 is a flowchart depicting exemplary steps performed in writing and reading memory contents for a generic storage cell implementation according to the principles of the present disclosure.

Referring now to FIG. 9, a flowchart depicts exemplary steps performed in writing and reading memory contents for a generic charge storage cell implementation according to the principles of the present disclosure. Charge storage cells may be arranged such that writing to one storage cell affects the reading of a previously written storage cell. In such a configuration, each write operation is performed on a different storage cell.

In various implementations, a single storage cell may include multiple charge storage regions. In this case, each write operation is performed on a different region within the storage cell. When storage cells containing multiple charge storage regions are joined together, such as in the configuration of FIG. 7, the principles of the present disclosure can still be employed. For example, writing can progress from a first location of a first storage cell to a second location of the first storage cell to a first location of a second cell to a second location of the second cell, etc.

Reverse reading can then be used to obtain the written data, with each raw value being calibrated by at least one of the values read previously. Calibration may take into account fewer than all of the previously read values if the effect of prior values is significantly attenuated. In various implementations, a single storage location may be written to in different modes, such that discrete values can be read from the storage location in different modes.

Control begins in step 500, where the first mode/location is written. Control continues in step 502, where the second mode/location is written. Control continues until the Nth mode/location is written in step 506. In various implementations, a single storage cell may contain multiple charge storage locations, and a single charge storage location may be written to in multiple modes.

Control continues in step 508, where control remains until contents of the storage cells are requested. Control may perform maintenance, such as a periodic refresh, on the storage cells during step 508. Even if the storage cells are nonvolatile, maintenance may be performed to combat any gradual charge leakage.

Control then continues in step 510, where the Nth mode/location is read. Control continues in step 512, where the (N−1)th mode/location is read. Control continues in step 514, where the (N−1)th mode/location value is calibrated based upon the value read from the Nth mode/location in step 510. Control continues reading and calibrating until the first mode/location is read in step 518. Control continues in step 520, where the value obtained from the first mode/location is calibrated based upon one or more of the values read from previous modes/locations. Control then ends.

Figure 10:
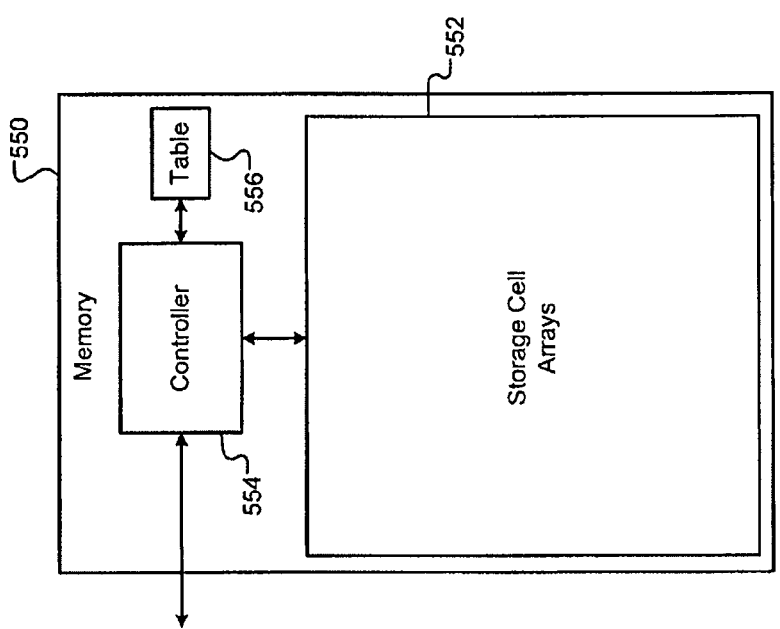
FIG. 10 is a functional block diagram of an exemplary memory according to the principles of the present disclosure.

Referring now to FIG. 10, a functional block diagram of an exemplary memory 550 according to the principles of the present disclosure is presented. The memory 550 includes storage cell arrays 552 and a controller 554. The memory 550 may also include storage and/or computation resources that implement a table 556.

The controller 554 communicates with a device or bus (not shown) external to the memory 550. The controller 554 receives data to be stored in the memory 550, and programs the storage cell arrays 552 with the data. The controller 554 calibrates values read from the storage cell arrays 552 so that data is accurately retrieved.

The values received by the controller 554 from the storage cell arrays 552 may include analog current and/or voltage measurements. Current through a storage cell may be a function of the gate voltage applied, the drain/source voltage applied, the programming state of the storage cell, and the programming state of adjacent storage cells or locations. The effect of adjacent storage cells or locations can be determined empirically or through modeling, which may be verified empirically.

These relationships may then be reduced to an equation, which can be evaluated by the controller 554. The table 556 may be constructed based upon the equation or empirically determined values. The stored data in a cell may be looked up in the table 556 based upon the current/voltage read and the state of adjacent storage cells or locations. In various implementations, the table is two-dimensional, with one dimension (such as rows) being the state of adjacent cells, and the other dimension (such as columns) being the uncalibrated measurement of charge in the storage cell of interest.

The rows and columns may correspond to specific values and/or ranges. The controller 554 and/or the table 556 may interpolate between entries in the table 556 to achieve a more accurate reading. Providing the table 556 reduces computation time and/or power consumed in evaluating equations at the expense of greater layout area in the memory 550.

Figure 11:
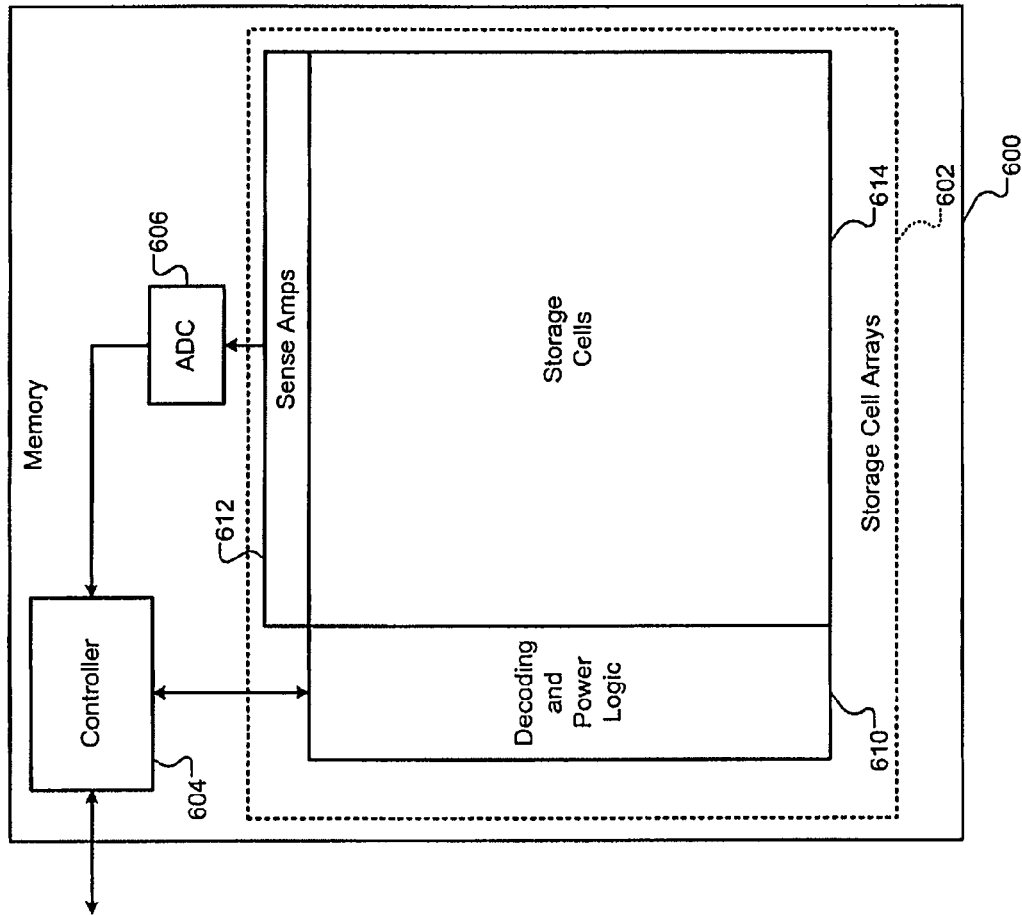
FIG. 11 is a more detailed functional block diagram of FIG. 10 according to the principles of the present disclosure.

Referring now to FIG. 11, a functional block diagram of an exemplary memory 600 according to the principles of the present disclosure is presented. The memory 600 includes storage cell arrays 602, a controller 604, and an analog-to-digital converter (ADC) 606. The storage cell arrays 602 may include decoding and power logic 610, sense amplifiers 612, and storage cells 614. The controller 604 communicates address and control signals to the decoding and power logic 610. These signals determine the erasing and programming of the storage cells 614.

When the controller 604 sends read control signals to the decoding and power logic 610, selected ones of the storage cells 614 interact with the sense amplifiers 612, and may provide current and/or voltage. Analog measurements made by the sense amplifiers 612 are converted to digital by the ADC 606, which communicates the digital values to the controller 604. The controller 604 can then calibrate the raw digital values as described above. The controller 604 may implement or interface with a digital signal processor to perform the calibration tasks.

Figure 12A:
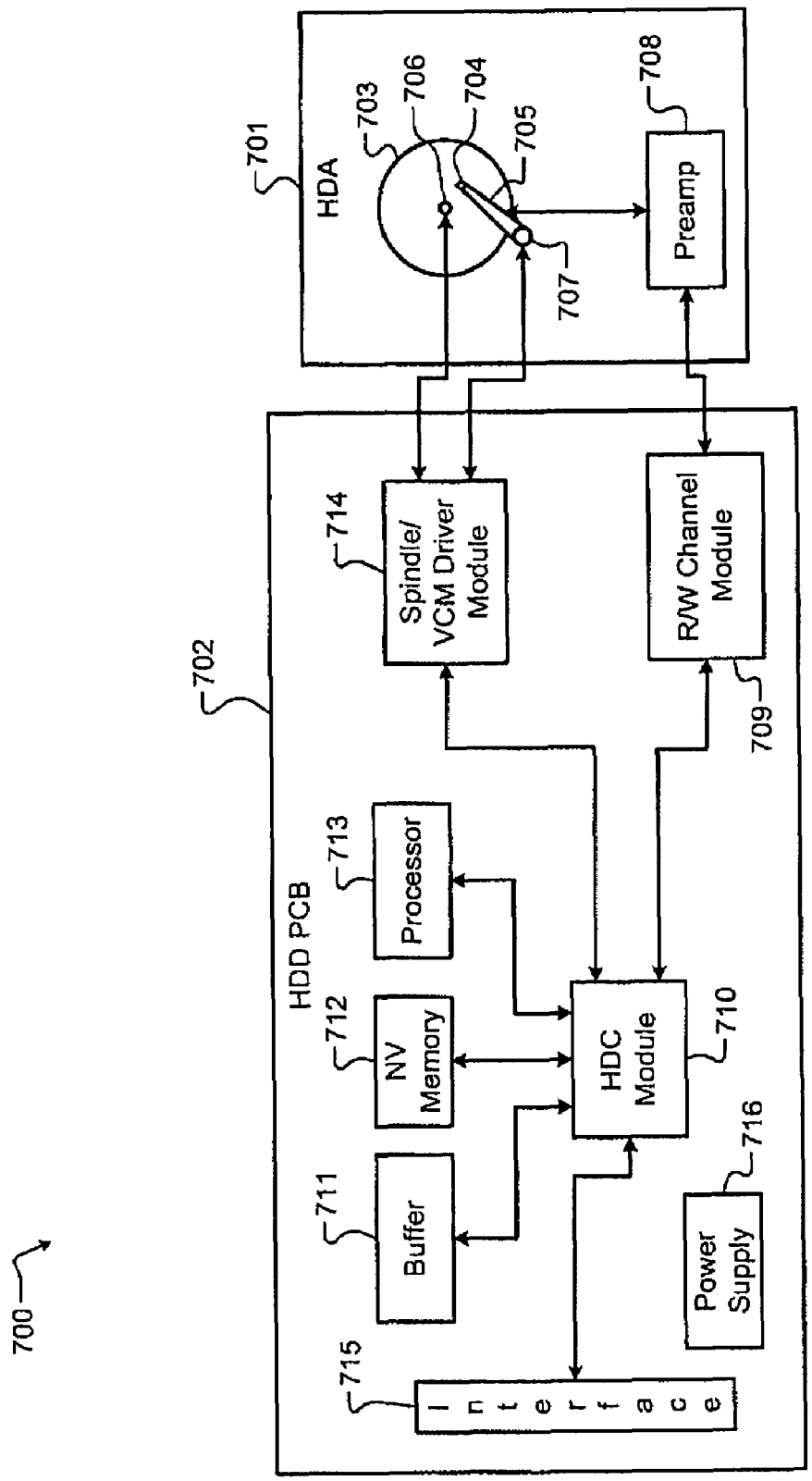
FIG. 12A is a functional block diagram of a hard disk drive.

Referring now to FIGS. 12A-12G, various exemplary implementations incorporating the teachings of the present disclosure are shown. Referring now to FIG. 12A, the teachings of the disclosure can be implemented in a buffer 711 or nonvolatile memory 712 of a hard disk drive (HDD) 700. The HDD 700 includes a hard disk assembly (HDA) 701 and a HDD PCB 702. The HDA 701 may include a magnetic medium 703, such as one or more platters that store data, and a read/write device 704.

The read/write device 704 may be arranged on an actuator arm 705 and may read and write data on the magnetic medium 703. Additionally, the HDA 701 includes a spindle motor 706 that rotates the magnetic medium 703 and a voice-coil motor (VCM) 707 that actuates the actuator arm 705. A preamplifier device 708 amplifies signals generated by the read/write device 704 during read operations and provides signals to the read/write device 704 during write operations.

The HDD PCB 702 includes a read/write channel module (hereinafter, "read channel") 709, a hard disk controller (HDC) module 710, the buffer 711, nonvolatile memory 712, a processor 713, and a spindle/VCM driver module 714. The read channel 709 processes data received from and transmitted to the preamplifier device 708.

The HDC module 710 controls components of the HDA 701 and communicates with an external device (not shown) via an I/O interface 715. The external device may include a computer, a multimedia device, a mobile computing device, etc. The I/O interface 715 may include wireline and/or wireless communication links.

The HDC module 710 may receive data from the HDA 701, the read channel 709, the buffer 711, nonvolatile memory 712, the processor 713, the spindle/VCM driver module 714, and/or the I/O interface 715. The processor 713 may process the data, including encoding, decoding, filtering, and/or formatting. The processed data may be output to the HDA 701, the read channel 709, the buffer 711, nonvolatile memory 712, the processor 713, the spindle/VCM driver module 714, and/or the I/O interface 715.

The HDC module 710 may use the buffer 711 and/or nonvolatile memory 712 to store data related to the control and operation of the HDD 700. The buffer 711 may include DRAM, SDRAM, etc. The nonvolatile memory 712 may include flash memory (including NAND and NOR flash memory), phase change memory, magnetic RAM, or multi-state memory, in which each memory cell has more than two states. The spindle/VCM driver module 714 controls the spindle motor 706 and the VCM 707. The HDD PCB 702 includes a power supply 716 that provides power to the components of the HDD 700.

Figure 12B:
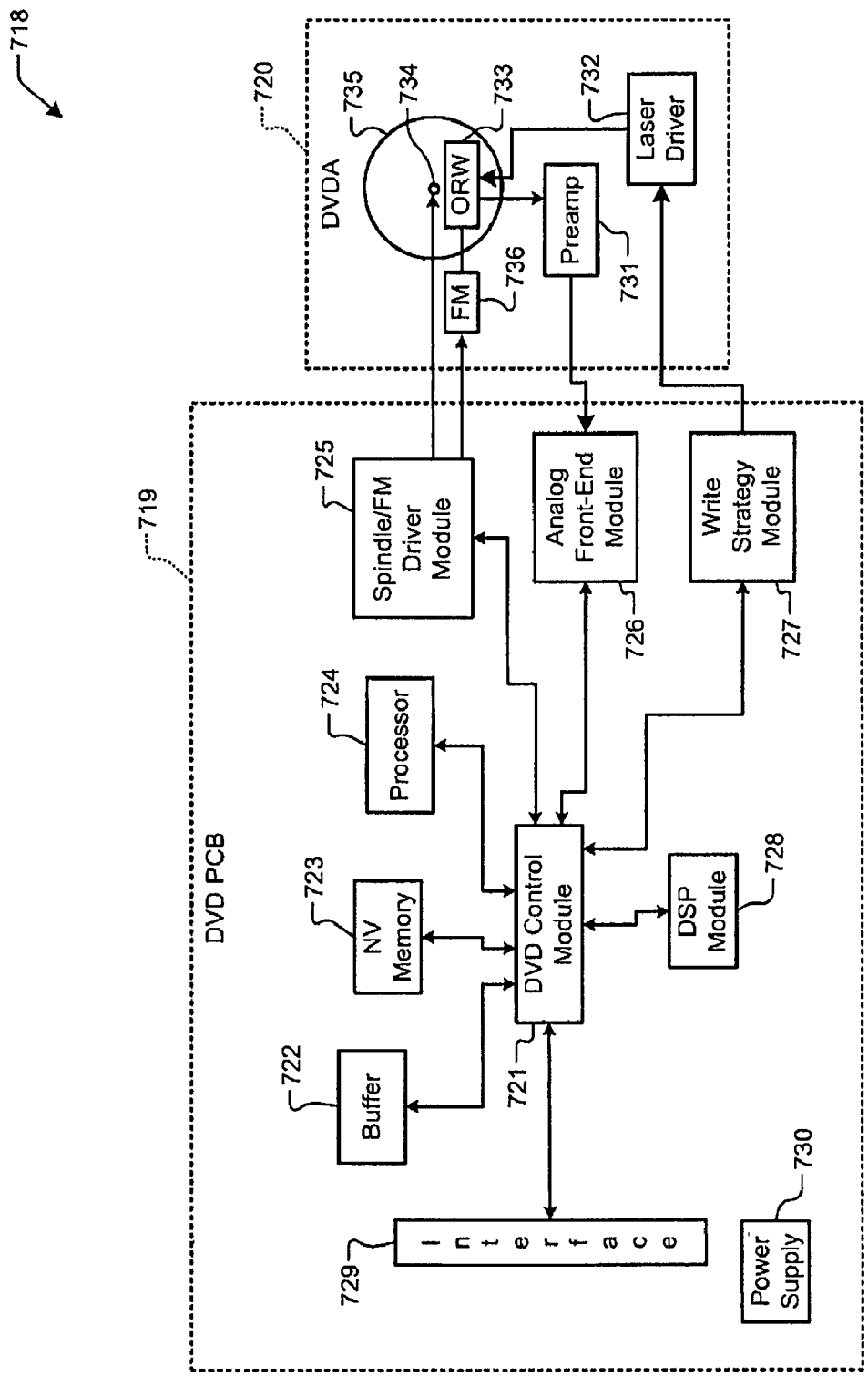
FIG. 12B is a functional block diagram of a DVD drive.

Referring now to FIG. 12B, the teachings of the disclosure can be implemented in a buffer 722 or nonvolatile memory 723 of a DVD drive 718 or of a CD drive (not shown). The DVD drive 718 includes a DVD PCB 719 and a DVD assembly (DVDA) 720. The DVD PCB 719 includes a DVD control module 721, the buffer 722, nonvolatile memory 723, a processor 724, a spindle/FM (feed motor) driver module 725, an analog front-end module 726, a write strategy module 727, and a DSP module 728.

The DVD control module 721 controls components of the DVDA 720 and communicates with an external device (not shown) via an I/O interface 729. The external device may include a computer, a multimedia device, a mobile computing device, etc. The I/O interface 729 may include wireline and/or wireless communication links.

The DVD control module 721 may receive data from the buffer 722, nonvolatile memory 723, the processor 724, the spindle/FM driver module 725, the analog front-end module 726, the write strategy module 727, the DSP module 728, and/or the I/O interface 729. The processor 724 may process the data, including encoding, decoding, filtering, and/or formatting.

The DSP module 728 performs signal processing, such as video and/or audio coding/decoding. The processed data may be output to the buffer 722, nonvolatile memory 723, the processor 724, the spindle/FM driver module 725, the analog front-end module 726, the write strategy module 727, the DSP module 728, and/or the I/O interface 729.

The DVD control module 721 may use the buffer 722 and/or nonvolatile memory 723 to store data related to the control and operation of the DVD drive 718. The buffer 722 may include DRAM, SDRAM, etc. The nonvolatile memory 723 may include flash memory (including NAND and NOR flash memory), phase change memory, magnetic RAM, or multi-state memory, in which each memory cell has more than two states. The DVD PCB 719 includes a power supply 730 that provides power to the components of the DVD drive 718.

The DVDA 720 may include a preamplifier device 731, a laser driver 732, and an optical device 733, which may be an optical read/write (ORW) device or an optical read-only (OR) device. A spindle motor 734 rotates an optical storage medium 735, and a feed motor 736 actuates the optical device 733 relative to the optical storage medium 735.

When reading data from the optical storage medium 735, the laser driver provides a read power to the optical device 733. The optical device 733 detects data from the optical storage medium 735, and transmits the data to the preamplifier device 731. The analog front-end module 726 receives data from the preamplifier device 731 and performs such functions as filtering and A/D conversion. To write to the optical storage medium 735, the write strategy module 727 transmits power level and timing information to the laser driver 732. The laser driver 732 controls the optical device 733 to write data to the optical storage medium 735.

Figure 12D:
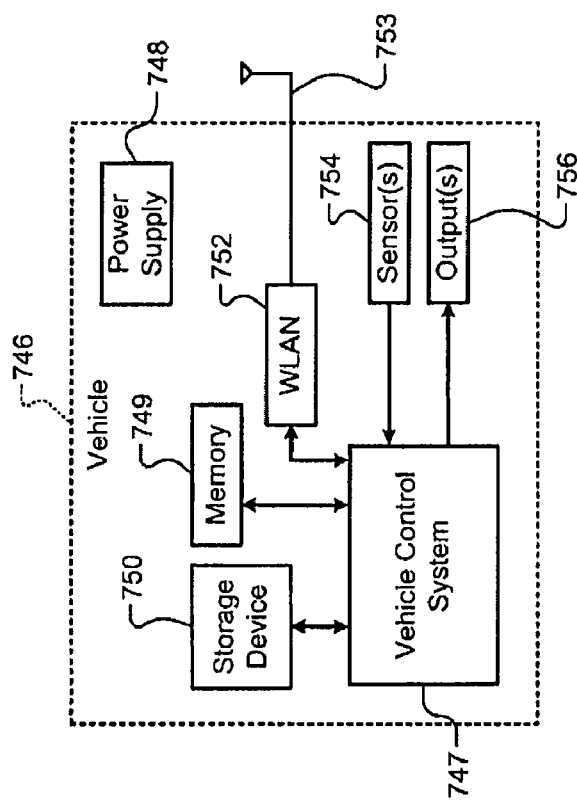
FIG. 12D is a functional block diagram of a vehicle control system.
Figure 12C:
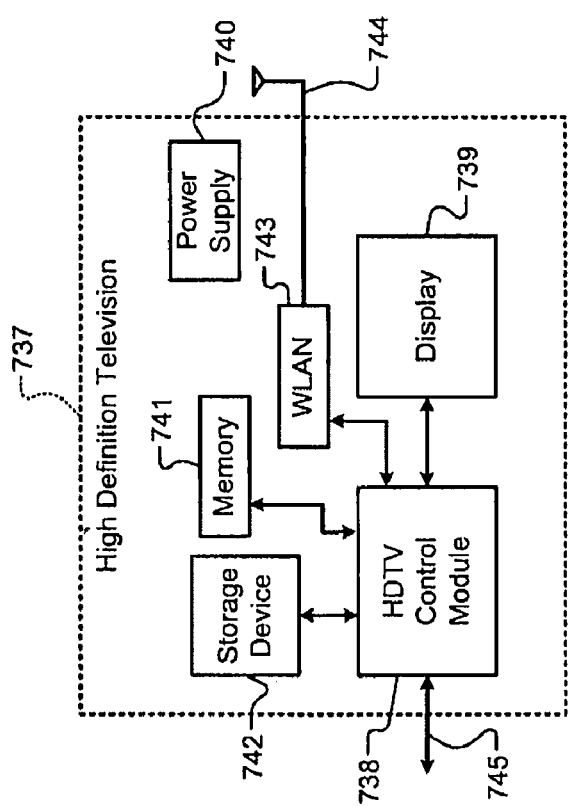
FIG. 12C is a functional block diagram of a high definition television.

Referring now to FIG. 12C, the teachings of the disclosure can be implemented in memory 741 of a high definition television (HDTV) 737. The HDTV 737 includes a HDTV control module 738, a display 739, a power supply 740, memory 741, a storage device 742, a WLAN interface 743 and associated antenna 744, and an external interface 745.

The HDTV 737 can receive input signals from the WLAN interface 743 and/or the external interface 745, which sends and receives information via cable, broadband Internet, and/or satellite. The HDTV control module 738 may process the input signals, including encoding, decoding, filtering, and/or formatting, and generate output signals. The output signals may be communicated to one or more of the display 739, memory 741, the storage device 742, the WLAN interface 743, and the external interface 745.

Memory 741 may include random access memory (RAM) and/or nonvolatile memory such as flash memory, phase change memory, or multi-state memory, in which each memory cell has more than two states. The storage device 742 may include an optical storage drive, such as a DVD drive, and/or a hard disk drive (HDD). The HDTV control module 738 communicates externally via the WLAN interface 743 and/or the external interface 745. The power supply 740 provides power to the components of the HDTV 737.

Referring now to FIG. 12D, the teachings of the disclosure may be implemented in memory 749 of a vehicle 746. The vehicle 746 may include a vehicle control system 747, a power supply 748, memory 749, a storage device 750, and a WLAN interface 752 and associated antenna 753. The vehicle control system 747 may be a powertrain control system, a body control system, an entertainment control system, an anti-lock braking system (ABS), a navigation system, a telematics system, a lane departure system, an adaptive cruise control system, etc.

The vehicle control system 747 may communicate with one or more sensors 754 and generate one or more output signals 756. The sensors 754 may include temperature sensors, acceleration sensors, pressure sensors, rotational sensors, airflow sensors, etc. The output signals 756 may control engine operating parameters, transmission operating parameters, suspension parameters, etc.

The power supply 748 provides power to the components of the vehicle 746. The vehicle control system 747 may store data in memory 749 and/or the storage device 750. Memory 749 may include random access memory (RAM) and/or nonvolatile memory such as flash memory, phase change memory, or multi-state memory, in which each memory cell has more than two states. The storage device 750 may include an optical storage drive, such as a DVD drive, and/or a hard disk drive (HDD). The vehicle control system 747 may communicate externally using the WLAN interface 752.

Figure 12F:
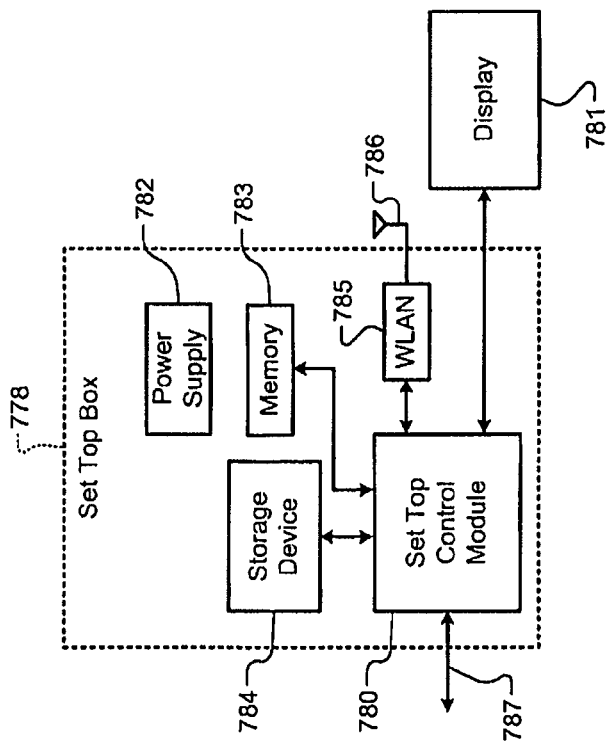
FIG. 12F is a functional block diagram of a set top box.
Figure 12E:
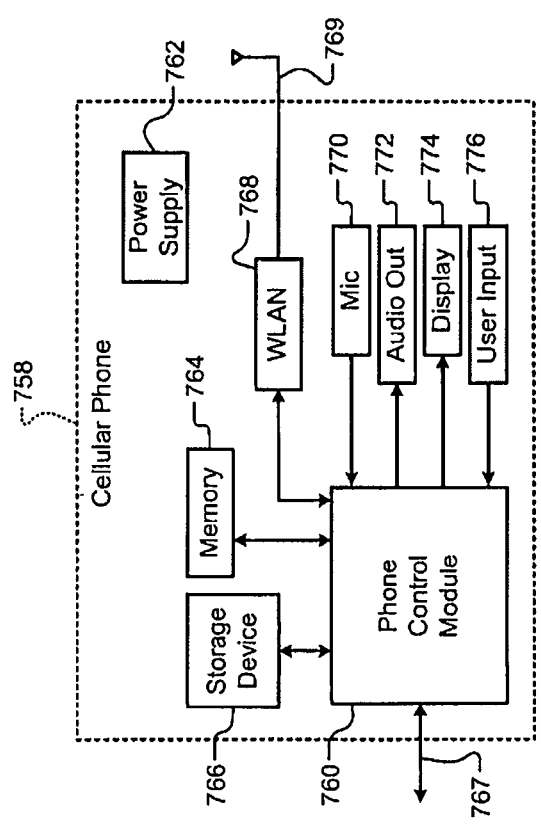
FIG. 12E is a functional block diagram of a cellular phone.

Referring now to FIG. 12E, the teachings of the disclosure can be implemented in memory 764 of a cellular phone 758. The cellular phone 758 includes a phone control module 760, a power supply 762, memory 764, a storage device 766, and a cellular network interface 767. The cellular phone 758 may include a WLAN interface 768 and associated antenna 769, a microphone 770, an audio output 772 such as a speaker and/or output jack, a display 774, and a user input device 776 such as a keypad and/or pointing device.

The phone control module 760 may receive input signals from the cellular network interface 767, the WLAN interface 768, the microphone 770, and/or the user input device 776. The phone control module 760 may process signals, including encoding, decoding, filtering, and/or formatting, and generate output signals. The output signals may be communicated to one or more of memory 764, the storage device 766, the cellular network interface 767, the WLAN interface 768, and the audio output 772.

Memory 764 may include random access memory (RAM) and/or nonvolatile memory such as flash memory, phase change memory, or multi-state memory, in which each memory cell has more than two states. The storage device 766 may include an optical storage drive, such as a DVD drive, and/or a hard disk drive (HDD). The power supply 762 provides power to the components of the cellular phone 758.

Referring now to FIG. 12F, the teachings of the disclosure can be implemented in memory 783 of a set top box 778. The set top box 778 includes a set top control module 780, a display 781, a power supply 782, memory 783, a storage device 784, and a WLAN interface 785 and associated antenna 786.

The set top control module 780 may receive input signals from the WLAN interface 785 and an external interface 787, which can send and receive information via cable, broadband Internet, and/or satellite. The set top control module 780 may process signals, including encoding, decoding, filtering, and/or formatting, and generate output signals. The output signals may include audio and/or video signals in standard and/or high definition formats. The output signals may be communicated to the WLAN interface 785 and/or to the display 781. The display 781 may include a television, a projector, and/or a monitor.

The power supply 782 provides power to the components of the set top box 778. Memory 783 may include random access memory (RAM) and/or nonvolatile memory such as flash memory, phase change memory, or multi-state memory, in which each memory cell has more than two states. The storage device 784 may include an optical storage drive, such as a DVD drive, and/or a hard disk drive (HDD).

Figure 12G:
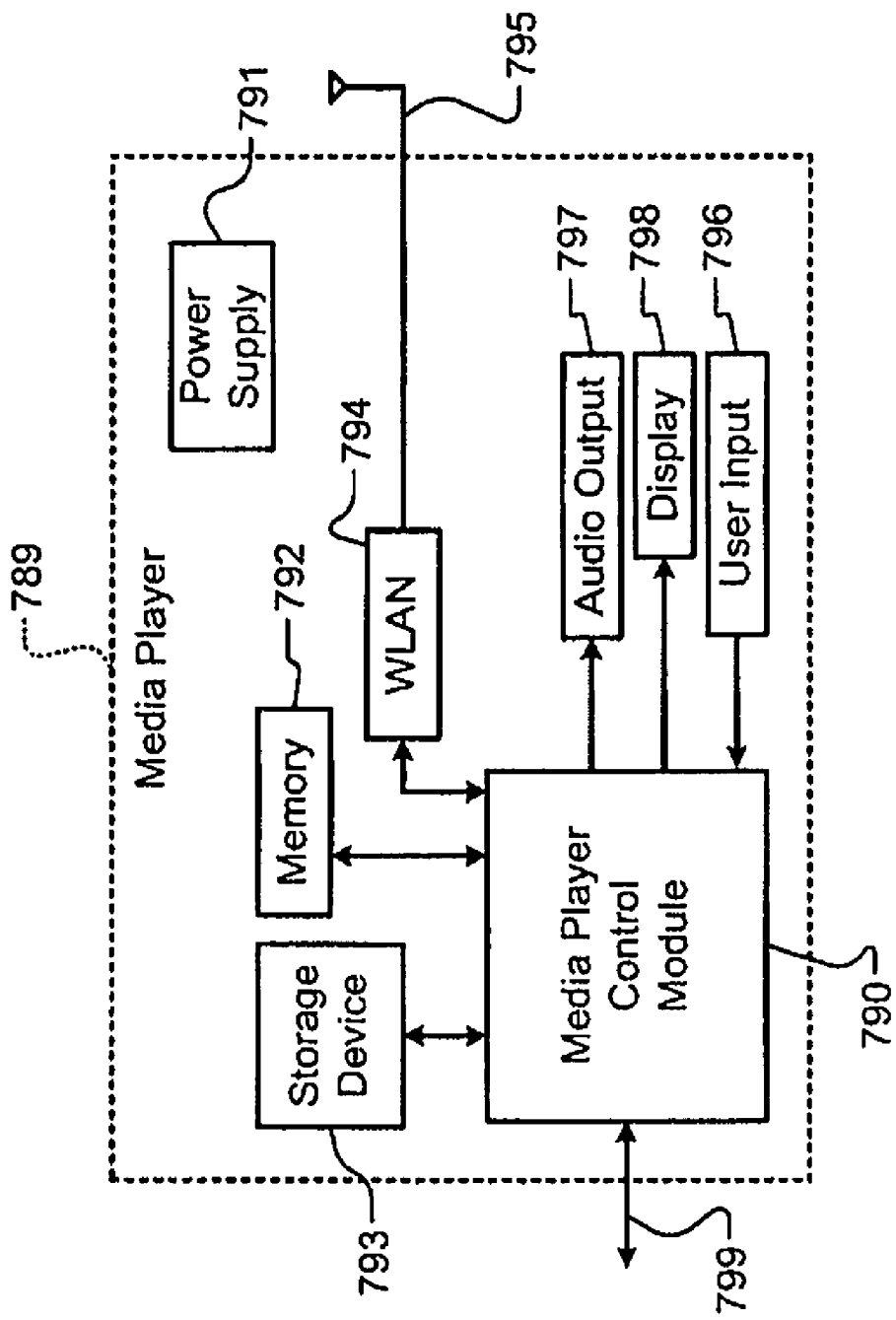
FIG. 12G is a functional block diagram of a media player.

Referring now to FIG. 12G, the teachings of the disclosure can be implemented in memory 792 of a media player 789. The media player 789 may include a media player control module 790, a power supply 791, memory 792, a storage device 793, a WLAN interface 794 and associated antenna 795, and an external interface 799.

The media player control module 790 may receive input signals from the WLAN interface 794 and/or the external interface 799. The external interface 799 may include USB, infrared, and/or Ethernet. The input signals may include compressed audio and/or video, and may be compliant with the MP3 format. Additionally, the media player control module 790 may receive input from a user input 796 such as a keypad, touchpad, or individual buttons. The media player control module 790 may process input signals, including encoding, decoding, filtering, and/or formatting, and generate output signals.

The media player control module 790 may output audio signals to an audio output 797 and video signals to a display 798. The audio output 797 may include a speaker and/or an output jack. The display 798 may present a graphical user interface, which may include menus, icons, etc. The power supply 791 provides power to the components of the media player 789. Memory 792 may include random access memory (RAM) and/or nonvolatile memory such as flash memory, phase change memory, or multi-state memory, in which each memory cell has more than two states. The storage device 793 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A storage system comprising:
   a charge storage cell having first and second charge storage regions, each capable of assuming a plurality of charge levels; and
   a controller that stores data by programming said first charge storage region to one of said plurality of charge levels and subsequently programming said second charge storage region to one of said plurality of charge levels, and that reads data stored in said first charge storage region by making a first measurement of said first charge storage region and a second measurement of said second charge storage region.

2. The storage system of claim 1 wherein said controller reads a charge level stored in said second charge storage region based upon said second measurement and independent of said first measurement.

3. The storage system of claim 1 further comprising a lookup table of charge levels indexed by said first measurement and said second measurement, wherein said controller determines a charge level stored in said first charge storage region using said lookup table.

4. The storage system of claim 1 wherein said charge storage cell comprises a nitride read-only memory transistor.

5. The storage system of claim 1 wherein said charge storage cell further comprises a third charge storage region capable of assuming a plurality of charge levels, said controller programs said third charge storage region after said second charge storage region, and said controller reads a charge level stored in said first charge storage region based upon said first measurement and at least one of said second measurement and a third measurement of said third charge storage region.

6. The storage system of claim 1 wherein said controller programs iteratively by making a measurement after each programming interval until a desired one of said plurality of charge levels is reached.

7. The storage system of claim 6 wherein a first programming interval for said second charge storage region is conducted based upon a charge level stored in said first charge storage region.

8. The storage system of claim 1 further comprising:
   a second charge storage cell having first and second charge storage regions, each capable of assuming a plurality of charge levels,
   wherein said controller programs said first and second charge storage regions of said second charge storage cell after programming said first and second charge storage regions of said charge storage cell,
   wherein said controller reads a charge level stored in said first charge storage region of said second charge storage cell based upon a third measurement of said first charge storage region of said second charge storage cell and a fourth measurement of said second charge storage region of said second charge storage cell, and
   wherein said controller reads a charge level stored in said second charge storage region of said charge storage cell based upon said second measurement and at least one of said third measurement and said fourth measurement.

9. A storage system comprising:
   M charge storage cells that each include a charge storage region that can assume one of N charge levels, wherein N and M are integers greater than one; and
   a controller that stores data by programming a first cell of said M charge storage cells to one of said N charge levels and subsequently programming a second cell of said M charge storage cells to one of said N charge levels, and that reads data stored in said first cell by making a first measurement of said first cell and a second measurement of said second cell.

10. The storage system of claim 9 wherein said controller reads a charge level stored in said second cell based upon said second measurement and independent of said first measurement.

11. The storage system of claim 9 further comprising a lookup table of charge levels indexed by said first measurement and said second measurement, wherein said controller reads a charge level stored in said first cell using said lookup table.

12. The storage system of claim 9 wherein said M charge storage cells comprise NAND flash transistors.

13. The storage system of claim 9 wherein said controller programs a third one of said M charge storage cells after said second cell and reads data stored in said first cell based upon said first measurement and at least one of said second measurement and a third measurement of said third cell.

14. The storage system of claim 9 wherein said controller programs iteratively by making a measurement after each programming interval until a desired one of said N charge levels is reached.

15. The storage system of claim 14 wherein a first programming interval for said second cell is conducted based upon a charge level stored in said first cell.

16. The storage system of claim 9 wherein said M charge storage cells each include a plurality of charge storage regions including said charge storage region that can assume one of N charge levels, wherein said controller programs first and second charge storage regions of said second cell after programming first and second charge storage regions of said first cell, and wherein said first charge storage region of said first cell comprises said charge storage region of said first cell and said first charge storage region of said second cell comprises said charge storage region of said second cell.

17. The storage system of claim 16 wherein said controller reads a charge level stored in said first charge storage region of said second cell based upon said second measurement and a third measurement of said second charge storage region of said second cell and wherein said controller reads a charge level stored in said second charge storage region of said first cell based upon a fourth measurement of said second charge storage region of said first cell and at least one of said second and third measurements.

18. A method comprising:
storing data by programming a first charge storage region of a charge storage cell to one of a plurality of charge levels;
storing data by programming a second charge storage region of said charge storage cell to one of said plurality of charge levels after programming said first charge storage region;
performing first and second measurements on said first and second charge storage regions, respectively, after programming said second charge storage region; and
reading data stored in said first charge storage region based upon said first and second measurements.

19. The method of claim 18 further comprising reading a charge level stored in said second charge storage region based upon said second measurement and independent of said first measurement.

20. The method of claim 18 further comprising:
providing a lookup table of charge levels indexed by said first measurement and said second measurement; and
reading a charge level stored in said first charge storage region using said lookup table.

21. The method of claim 18 wherein said charge storage cell comprises a nitride read-only memory transistor.

22. The method of claim 18 further comprising:
programming a third charge storage region of said charge storage cell after programming said second charge storage region;
performing a third measurement on said third charge storage region; and
reading a charge level stored in said first charge storage region based upon said first measurement and at least one of said second measurement and said third measurement.

23. The method of claim 18 further comprising programming iteratively by making a measurement after each programming interval until a desired one of said plurality of charge levels is reached.

24. The method of claim 23 further comprising conducting a first programming interval for said second charge storage region based upon a charge level stored in said first charge storage region.

25. The method of claim 18 further comprising:
programming first and second charge storage regions of a second charge storage cell after programming said first and second charge storage regions of said charge storage cell;
performing third and fourth measurements on said first and second charge storage regions of said second charge storage cell, respectively;
reading a charge level stored in said first charge storage region of said second charge storage cell based upon said third fourth measurements; and
reading a charge level stored in said second charge storage region of said charge storage cell based upon said second measurement and at least one of said third and fourth measurements.

26. A method comprising:
storing data by programming a first cell of M charge storage cells to one of N charge levels, wherein N and M are integers greater than one;
storing data by programming a second cell of said M charge storage cells to one of said N charge levels after programming said first cell;
performing first and second measurements on said first and second cells, respectively, after programming said second cell; and
reading data stored in said first cell based upon said first and second measurements.

27. The method of claim 26 further comprising reading a charge level stored in said second cell based upon said second measurement and independent of said first measurement.

28. The method of claim 26 further comprising:
providing a lookup table of charge levels indexed by said first measurement and said second measurement; and
reading a charge level stored in said first cell using said lookup table.

29. The method of claim 26 wherein said M charge storage cells comprise NAND flash transistors.

30. The method of claim 26 further comprising:
programming a third one of said M charge storage cells after programming said second cell;
performing a third measurement on said third cell; and
reading a charge level stored in said first cell based upon said first measurement and at least one of said second and third measurements.

31. The method of claim 26 further comprising programming iteratively by making a measurement after each programming interval until a desired one of said N charge levels is reached.

32. The method of claim 31 further comprising conducting a first programming interval for said second cell based upon a charge level stored in said first cell.

33. The method of claim 26 further comprising programming first and second charge storage regions of said second cell after programming first and second charge storage regions of said first cell, wherein said first charge storage region of said first cell comprises said charge storage region of said first cell and said first charge storage region of said second cell comprises said charge storage region of said second cell.

34. The method of claim 33 further comprising:
performing third and fourth measurements on said second charge storage region of said first and second cells, respectively;
reading a charge level stored in said first charge storage region of said second cell based upon said second and fourth measurements; and
reading a charge level stored in said second charge storage region of said first cell based upon said third measurement and at least one of said second and fourth measurements.

* * * * *